United States Patent
Wu et al.

(10) Patent No.: US 7,027,298 B2
(45) Date of Patent: Apr. 11, 2006

(54) COMPUTER SERVER

(75) Inventors: Chia-Kang Wu, Taipei (TW); Yu-Jen Liang, Taipei (TW); Fu-Jung Hsui, Taipei (TW)

(73) Assignee: Tatung Co., Ltd., Taipei (TW)

( * ) Notice: Subject to any disclaimer, the term of this patent is extended or adjusted under 35 U.S.C. 154(b) by 0 days.

(21) Appl. No.: 11/197,415

(22) Filed: Aug. 5, 2005

(65) Prior Publication Data

US 2006/0050487 A1   Mar. 9, 2006

(30) Foreign Application Priority Data

Sep. 9, 2004   (TW) ............................... 93214389 U

(51) Int. Cl.
*G06F 1/16*   (2006.01)
(52) U.S. Cl. ............... 361/685; 361/684; 361/724; 361/726; 312/223.1; 312/223.2

(58) Field of Classification Search .................... None
See application file for complete search history.

(56) References Cited

U.S. PATENT DOCUMENTS

| 6,418,012 | B1 * | 7/2002 | Dials et al. ................. 361/685 |
| 6,477,055 | B1 * | 11/2002 | Bolognia et al. ........... 361/724 |
| 6,556,438 | B1 * | 4/2003 | Bolognia et al. ........... 361/687 |
| 2005/0259390 | A1 * | 11/2005 | Wu et al. .................... 361/684 |

* cited by examiner

*Primary Examiner*—Lynn Feild
*Assistant Examiner*—Anthony Q. Edwards
(74) *Attorney, Agent, or Firm*—Bacon & Thomas, PLLC

(57) ABSTRACT

A computer server is disclosed having one of the set of drive bays thereof constructed in the form of a dual-purpose bay with a hard disk drive female connector and a combo device female connector so that a hard disk drive and a combo device can be alternatively installed in the dual-purpose bay, which combo device having a DVD-ROM male connector and a floppy disk drive male connector integrated into a combo device male connector electrically connectable to the combo device female connector of the dual-purpose bay.

4 Claims, 4 Drawing Sheets

COMPUTER SERVER

BACKGROUND OF THE INVENTION

1. Field of the Invention

The present invention relates to a computer server and more particularly, to such a computer server, which provides a plurality of drive bays for selectively receive a hard disk drive and a combo device.

2. Description of Related Art

Computer servers are widely used in enterprises and organizations for the advantages of high data storage capacity and system stability. A computer server has multiple hard disk drives connected in series. Regular computer servers are standardized in size for the convenience of maintenance and management. In order to enhance market competitiveness, the limited internal space of a standard-sized computer server must be fully utilized to provide more data storage capacity.

However, similar to a regular personal computer, a computer server needs to use a DVD-ROM or floppy disk drive for certain works such as software installation, new edition update. However, these works are not frequently required. It is not economic to spare a drive bay in a computer server for a DVD-ROM/floppy disk drive.

SUMMARY OF THE INVENTION

The present invention has been accomplished under the circumstances in view. It is therefore the main object of the present invention to provide a computer server, which fully utilizes the limited bay space such that the user can selectively insert a hard disk drive or a combo device into one drive bay.

To achieve this and other objects of the present invention, the computer server comprises a plurality of drive bays, and at least one combo device. The drive bays each comprises two opposite sidewalls, a back wall, two sliding grooves respectively mounted on the two sidewalls, and a first female connector provided at the back wall, wherein at least one of the plurality of drive bays comprises a second female connector. The at least one combo device capable of correspondingly to insert into the at least one of the drive bays which has the second female connector, the at least one combo device comprises an optical disk drive, a floppy disk drive, and a rack. The optical disk drive has an optical disk drive male connector. The floppy disk drive has a floppy disk drive male connector. The rack for stacking up the optical disk drive and the floppy disk drive, the rack comprises a base frame, two side bars fixedly provided at two opposite lateral sides of the base frame, two sliding rails respectively provided at the two side bars for coupling to the two sliding grooves of the at least one of the drive bays which has the second female connector, and a combo device male connector integrated with the optical disk drive male connector and the floppy disk drive male connector and electrically connectable to the second female connector of the at least one of the drive bays.

Therefore, the invention has an optical disk drive and a floppy disk drive joined together to form a combo device corresponding to insert into the drive bay. In addition, the user can insert the combo device into the drive bay for data update. After data update, the user can remove the combo device from the drive bay, and then insert a hard disk drive into the drive bay under a hot plug environment. This design fully utilizes the limited internal space of the computer server. Because the combo device is a mobile design, it can be selectively installed in one of a number computer server, the design of the present invention saves much hardware installation cost.

The optical disk drive can be a thin type CD-ROM drive. Each the drive bays can be having a recess in a front wall thereof for receiving the optical disk drive of the combo device, and a spring-supported stop plate pivoted to the front wall adjacent to the recess for keeping the opening from sight after removal of the combo device from the respective drive bay. The computer server can further comprise a plurality of detachable hard disk drives each comprises a first male connector for electrically connecting to the first female connector of each of the drive bays correspondingly.

DETAILED DESCRIPTION OF THE PREFERRED EMBODIMENT

Figure 1A:
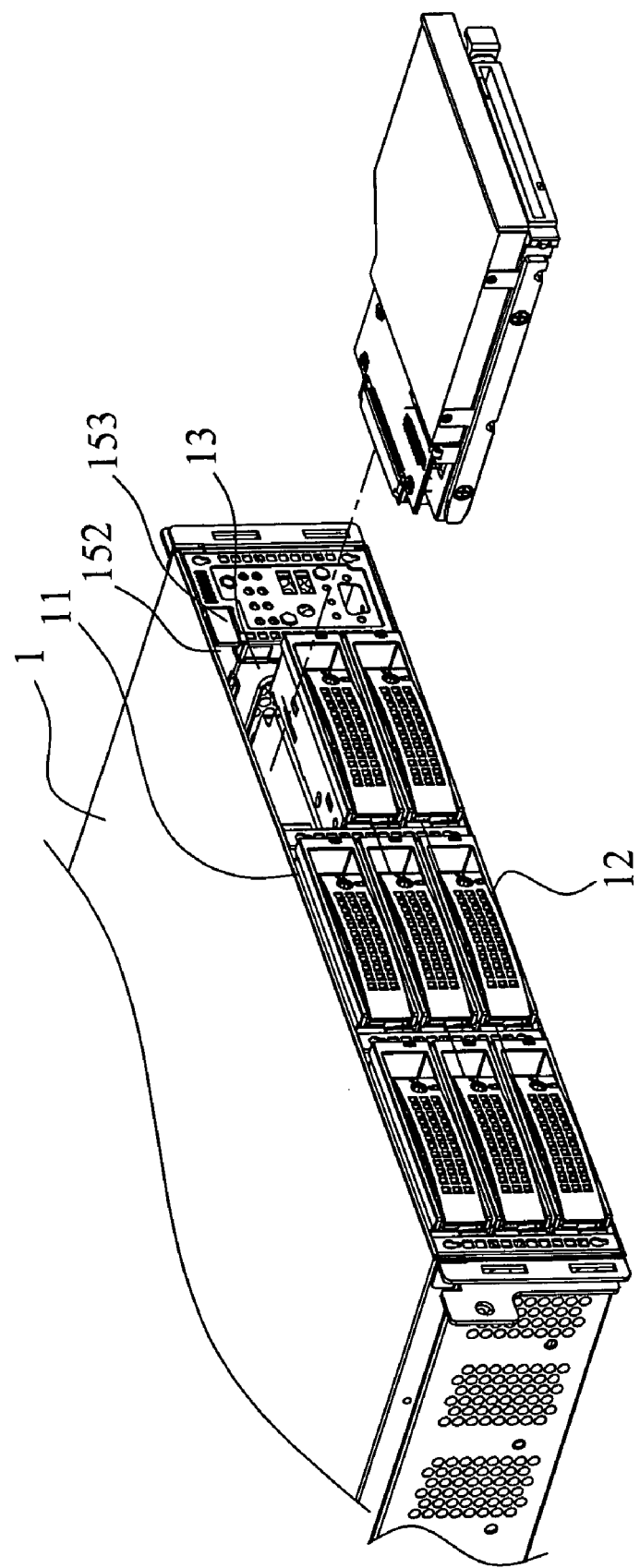
FIG. 1a is a schematic front view of a computer server constructed according to the present invention.

Referring to FIG. 1a, a computer server 1 is shown having an access side 11. In general, a plurality of hard disk drives 12 are mounted on the inside and connected in series and respectively made in the form of a mobile rack that is detachably insertable into the inside of the computer server 1 through the access side 11. A conventional computer server must be equipped with a CD-ROM player or floppy disk, or both CD-ROM player and floppy disk for using in certain conditions to make a particular work, for example, system reinstall. However, every computer user knows the chance of such reinstall is not so high that a hard disk space should be spared for a CD-ROM drive or floppy disk. Therefore, the present invention has the right upper corner of the access side 11 to be used as a dual-purpose drive bay 13 instead of the original drive bay. The dual-purpose drive bay 13 is provided for mobile combo device/hard disk drive.

Figure 1B:
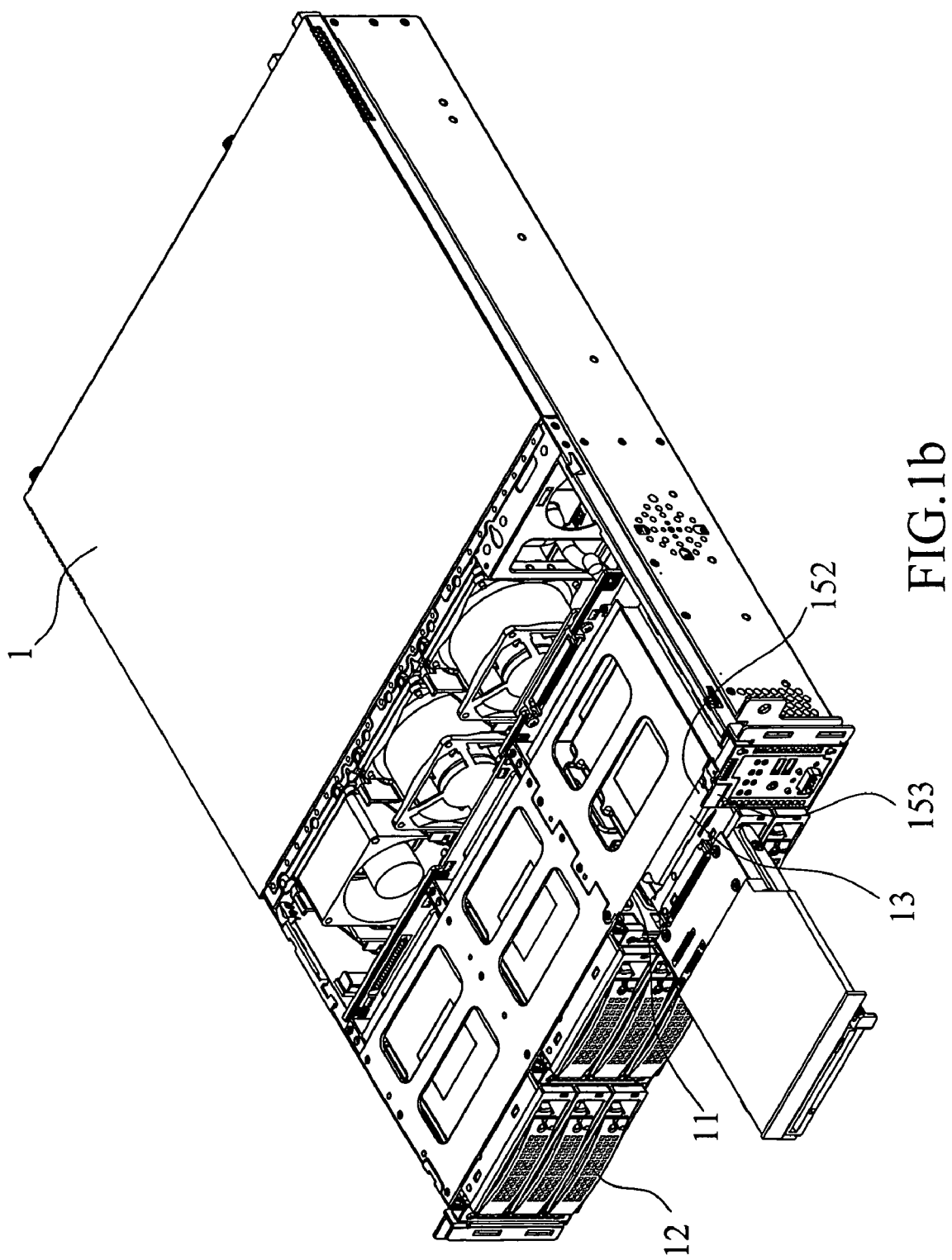
FIG. 1b is a perspective view of the present invention, showing the arrangement of the dual-purpose bay in the computer server.

Referring to FIG. 1b, the dual-purpose drive bay 13 comprises two opposite sidewalls 14 and 15, a back wall 16, two sliding grooves 141 and 151 respectively symmetrically mounted on the two sidewalls 14 and 15 at an inner side, a hard disk drive female connector 161 and a combo device female connector 162 respectively installed in the back wall 16.

Figure 2:
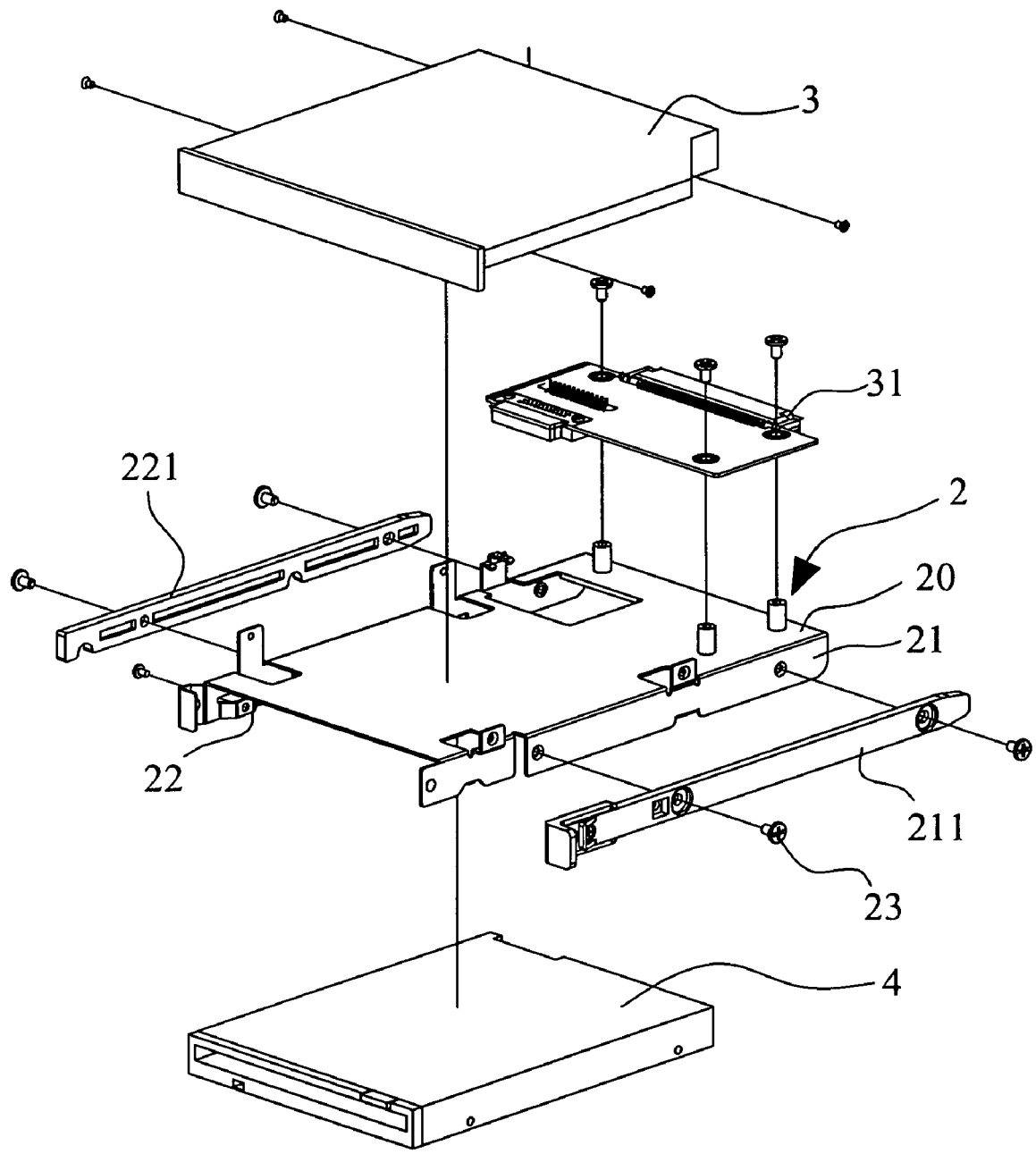
FIG. 2 is an exploded view of a mobile combo device according to the present invention.
Figure 3:
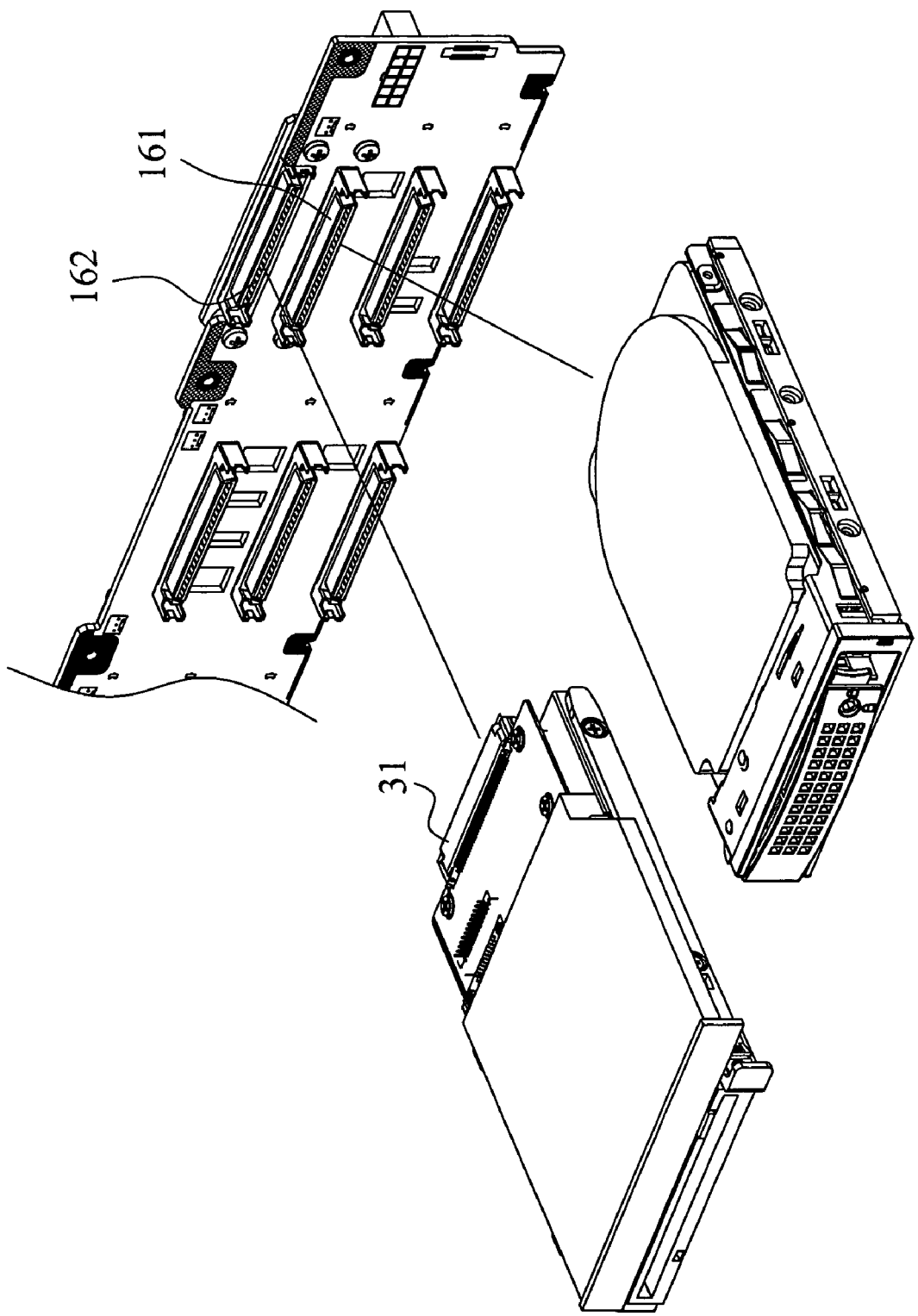
FIG. 3 is a schematic drawing showing the relationship between mobile combo device/hard disk drive and the relative female connectors at the back wall of the dual-purpose bay according to the present invention.

Referring to FIG. 2, a mobile combo device in accordance with the present invention is shown comprised of a rack 2, a thin type CD-ROM drive 3, and a floppy disk drive 4. The rack 2 is stacking up the thin type CD-ROM drive 3 and the floppy disk drive 4 and adapted to hold the thin type CD-ROM drive 3 and the floppy disk drive 4, comprising a base frame 20, two side bars 21 and 22 fixedly provided at two opposite lateral sides of the base frame 20, two sliding rails 211 and 222 respectively provided at the two side bars 21 and 22 for coupling to the two sliding grooves 141 and 151, and fastening means 23 to fasten the thin type CD-ROM drive 3 and the floppy disk drive 4 to the rack 2. The fastening means 23 can be tenon-and-mortise joint means, screw joint means, hook means, or any of a variety of conventional fastening structures. The two sliding rails 211 and 222 of the two sidebars 21 and 22 of the rack 2 are respectively slidably connectable to the sliding grooves 141 and 151 of the dual-purpose drive bay 13 (FIG. 1b) so that the mobile combo device can be mounted in the dual-purpose drive bay 13 and electrically connected to the combo device female connector 162. After removal of the combo device from the dual-purpose drive bay 13, a mobile hard disk drive can be inserted into the dual-purpose drive bay 13 and coupled to the sliding grooves 141 and 151 and electrically connected to the hard disk drive female connector 161.

A thin type CD-ROM drive 3 and a floppy disk drive 4 have a respective male connector for connecting to a respective female connector in a computer or computer server. In case a bay is designed in a computer or computer server for thin type CD-ROM, floppy disk drive, or hard disk drive, it must be equipped with a CD-ROM female connector, a floppy disk drive female connector and a hard disk drive female connector so that a thin type CD-ROM drive, Floppy disk drive, a floppy disk drive and a hard disk drive can be alternatively installed in the bay. According to conventional designs, the position of the hard disk drive female connector is in conflict with the position of the floppy disk drive female connector. In order to eliminate this problem, the present invention has a CD-ROM female connector and a floppy disk drive female connector be integrated into a combo device female connector 31 and installed in the rack 2 (see FIG. 2). When inserted the mobile combo device into the dual-purpose drive bay 13, the combo device female connector 31 is connected to the combo device female connector 162 for signal transmission. After removal of the combo device from the dual-purpose drive bay 13, a mobile hard disk drive can be inserted into the dual-purpose drive bay 13 and connected to the hard disk drive female connector 161 for signal transmission.

Referring to FIG. 1a again, the width between the two sidewalls 14 and 15 of the dual-purpose drive bay 13 is substantially equal to the width of a hard disk drive 12 so that a hard disk drive can be inserted into the dual-purpose drive bay 13. However, the thin type CD-ROM drive 3 has a width greater than a hard disk drive 12. In order to receive the mobile combo device, one sidewall 15 of the dual-purpose drive bay 13 is made having an opening 152 corresponding to the thin-type CD-ROM drive 3 of the mobile combo device. Further, a stop plate 153 is pivotally provided at the front side of the opening 152 and supported on a return spring (not shown) to keep the opening 152 from sight after removal of the mobile combo device from the dual-purpose drive bay 13. Upon insertion of the mobile combo device into the dual-purpose drive bay 13, the stop plate 153 is turned inwards toward the inside of the dual-purpose drive bay 13 for enabling the mobile combo device to be set into position in the dual-purpose drive bay 13. After removal of the mobile combo device from the dual-purpose drive bay 13, the return spring automatically returns the stop plate 153 to keep the opening 152 from sight.

In general, the invention has a CD-ROM drive and a floppy disk drive joined together to form a combo device corresponding to insert into the drive bay. This design fully utilizes the limited internal space of the computer server. Because the combo device is a mobile design, it can be selectively installed in one of a number computer server, the design of the present invention saves much hardware installation cost.

Although the present invention has been explained in relation to its preferred embodiment, it is to be understood that many other possible modifications and variations can be made without departing from the spirit and scope of the invention as hereinafter claimed.

What is claimed is:

1. A computer server comprising:
   a plurality of drive bays, said drive bays each comprising two opposite sidewalls, a back wall, two sliding grooves respectively mounted on said two sidewalls, and a first female connector provided at said back wall; wherein at least one of the plurality of drive bays comprises a second female connector; and
   at least one combo device capable of correspondingly inserting into said at least one of the drive bays which having said second female connector;
   wherein, said at least one combo device comprising:
   an optical disk drive, said optical disk drive having an optical disk drive male connector;
   a floppy disk drive, said floppy disk drive having a floppy disk drive male connector; and
   a rack for stacking up said optical disk drive and said floppy disk drive, said rack comprising a base frame, two side bars fixedly provided at two opposite lateral sides of said base frame, two sliding rails respectively provided at said two side bars for coupling to the two sliding grooves of said at least one of the drive bays which having said second female connector, and a combo device male connector integrated with said optical disk drive male connector and said floppy disk drive male connector and electrically connectable to the second female connector of said at least one of the drive bays.

2. The computer server as claimed in claim 1, wherein said optical disk drive is a thin type CD-ROM drive.

3. The computer server as claimed in claim 1, wherein each said drive bays has a recess in a front wall thereof for receiving the optical disk drive of said combo device, and a spring-supported stop plate pivoted to the front wall adjacent to the recess for keeping a opening from sight after removal of said combo device from the respective drive bay.

4. The computer server as claimed in claim 1, wherein further comprises a plurality of detachable hard disk drives each comprises a first male connector for electrically connecting to the first female connector of each of said drive bays correspondingly.

* * * * *